United States Patent
Hamamoto

(10) Patent No.: US 8,295,663 B2
(45) Date of Patent: Oct. 23, 2012

(54) SUPER-LUMINESCENT LIGHT EMITTING DIODE

(75) Inventor: Kiichi Hamamoto, Fukuoka (JP)

(73) Assignee: Kyushu University, National University Corporation, Fukuoka-Shi, Fukuoka (JP)

( * ) Notice: Subject to any disclaimer, the term of this patent is extended or adjusted under 35 U.S.C. 154(b) by 333 days.

(21) Appl. No.: 12/450,347

(22) PCT Filed: Mar. 21, 2008

(86) PCT No.: PCT/JP2008/000674
§ 371 (c)(1),
(2), (4) Date: Sep. 22, 2009

(87) PCT Pub. No.: WO2008/117527
PCT Pub. Date: Oct. 2, 2008

(65) Prior Publication Data
US 2010/0040323 A1  Feb. 18, 2010

(30) Foreign Application Priority Data

Mar. 23, 2007  (JP) .................. 2007-076585

(51) Int. Cl.
G02B 6/26 (2006.01)
G02B 6/10 (2006.01)

(52) U.S. Cl. ........................ 385/43; 385/130

(58) Field of Classification Search ............ 385/43, 385/130
See application file for complete search history.

(56) References Cited

U.S. PATENT DOCUMENTS

| | | | |
|---|---|---|---|
| 5,339,606 A * | 8/1994 | Benz | 53/444 |
| 5,724,463 A * | 3/1998 | Deacon et al. | 385/27 |
| 6,111,998 A | 8/2000 | Ido et al. | |
| 6,148,132 A | 11/2000 | Hamamoto | |
| 6,321,011 B2 * | 11/2001 | Deacon | 385/50 |
| 6,339,606 B1 | 1/2002 | Alphonse | |
| 6,393,186 B1 * | 5/2002 | Deacon | 385/50 |
| 6,522,794 B1 * | 2/2003 | Bischel et al. | 385/4 |
| 6,687,267 B2 * | 2/2004 | Bukkems | 372/20 |
| 6,690,863 B2 * | 2/2004 | Deliwala | 385/50 |
| 6,738,546 B2 * | 5/2004 | Deliwala | 385/50 |
| 6,760,498 B2 * | 7/2004 | Delwala | 385/14 |
| 6,768,758 B2 * | 7/2004 | Hamamoto | 372/50.22 |
| 6,795,622 B2 * | 9/2004 | Forrest et al. | 385/50 |
| 6,819,853 B2 * | 11/2004 | Lam et al. | 385/131 |
| 6,842,546 B2 * | 1/2005 | Deliwala | 385/14 |
| 6,856,732 B2 * | 2/2005 | Liu et al. | 385/38 |
| 6,891,653 B2 * | 5/2005 | Liu et al. | 359/279 |

(Continued)

FOREIGN PATENT DOCUMENTS

JP  6-237011  8/1994

(Continued)

*Primary Examiner* — K. Cyrus Kianni
(74) *Attorney, Agent, or Firm* — McGinn IP Law Group, PLLC

(57) ABSTRACT

To provide a super luminescent light emitting diode comprising an optical waveguide structure which supplies particularly-high optical output. The super-luminescent light emitting diode includes: a first optical waveguide, of which one end is optically connected to one end of a multimode interference optical waveguide, and of which the other end forms a first light emitting edge; and a second optical waveguide, of which one end is optically connected to the other end of the multimode interference optical waveguide, and of which the other end forms a second light emitting edge. Each of the first and second optical waveguides has a width smaller than the width of the multimode interference optical waveguide.

19 Claims, 8 Drawing Sheets

U.S. PATENT DOCUMENTS

| | | | |
|---|---|---|---|
| 6,898,352 B2* | 5/2005 | Deliwala | 385/40 |
| 7,112,827 B2* | 9/2006 | Hayakawa et al. | 257/116 |
| 7,565,084 B1* | 7/2009 | Wach | 398/201 |
| 7,860,358 B2* | 12/2010 | Tsuda et al. | 385/16 |
| 7,965,949 B1* | 6/2011 | Wach | 398/200 |
| 7,983,318 B2* | 7/2011 | Hayakawa | 372/50.11 |
| 8,027,552 B2* | 9/2011 | McNie et al. | 385/14 |
| 2001/0028769 A1* | 10/2001 | Deacon | 385/50 |
| 2002/0154848 A1* | 10/2002 | Shimonaka et al. | 385/14 |
| 2002/0160543 A1* | 10/2002 | Liu et al. | 438/16 |
| 2002/0164103 A1* | 11/2002 | Shekel et al. | 385/8 |
| 2002/0172464 A1* | 11/2002 | Delwala | 385/40 |
| 2002/0173058 A1* | 11/2002 | Liu et al. | 438/16 |
| 2003/0003734 A1* | 1/2003 | Delwala | 438/689 |
| 2003/0003735 A1* | 1/2003 | Deliwala | 438/689 |
| 2003/0003736 A1* | 1/2003 | Delwala | 438/689 |
| 2003/0003737 A1* | 1/2003 | Delwala | 438/689 |
| 2003/0003738 A1* | 1/2003 | Delwala | 438/689 |
| 2003/0007719 A1* | 1/2003 | Forrest et al. | 385/14 |
| 2003/0059152 A1* | 3/2003 | Delwala | 385/14 |
| 2003/0063836 A1* | 4/2003 | Lam et al. | 385/14 |
| 2003/0147432 A1* | 8/2003 | Bukkems | 372/20 |
| 2004/0119079 A1* | 6/2004 | Hayakawa et al. | 257/80 |
| 2005/0163459 A1* | 7/2005 | Deliwala | 385/147 |
| 2006/0274802 A1* | 12/2006 | Aoki et al. | 372/45.01 |
| 2009/0034909 A1* | 2/2009 | Mizumoto et al. | 385/42 |
| 2009/0214161 A1* | 8/2009 | Tsuda et al. | 385/22 |
| 2010/0020840 A1* | 1/2010 | Hayakawa | 372/50.11 |

FOREIGN PATENT DOCUMENTS

| | | |
|---|---|---|
| JP | 10-73736 | 3/1998 |
| JP | 11-68240 | 3/1999 |
| JP | 11-68241 | 3/1999 |
| JP | 2000-244009 | 9/2000 |
| JP | 2002-518857 | 6/2002 |
| JP | 2006-186250 | 7/2006 |
| JP | 2007-273690 | 10/2007 |
| WO | WO 2005/060058 A1 | 6/2005 |

* cited by examiner (a)

(b)

(a)

(b)

SUPER-LUMINESCENT LIGHT EMITTING DIODE

TECHNICAL FIELD

The present invention relates to a super luminescent light emitting diode, and in particular, to an optical waveguide structure which supplies high optical output.

RELATED ART

Recently, research and development on a super-luminescent light emitting diode (SLED) expected to be large in light emitting wavelength width (equal to or more than several tens of nm in half width) and large in light emitting output as compared to a semiconductor laser has actively been progressed. Unlike the semiconductor laser used for communication, or the like, mainly because this super-luminescent light emitting diode is a non-interference light source or is capable of covering a wide wavelength band with one light source. A representative example using the former characteristic is optical coherent tomography (OCT) and the latter characteristic is wavelength division multiplex (WDM), or the like.

Unlike an LED of the related art, it has generally been known that in particular the super-luminescent light emitting diode may obtain high optical output as compared to the LED since stimulated emission is included in a light emitting principle. Also, since the aforementioned SLED is applied for the OCT or optical communication, or the like, it has been put to practical use in a near infrared light wavelength band (for example, 850 nm band, 1300 nm band, 1550 nm band, or the like).

[PATENT DOCUMENT 1] Japanese Laid-open patent publication No. 11-068241
[PATENT DOCUMENT 2] Japanese Laid-open patent publication No. 11-068240

DISCLOSURE OF THE INVENTION

Problem to be Solved by the Invention

Although the aforementioned SLED has large light emitting output as compared to the LED, there are needs for further high optical output from the viewpoint of high performance of the OCT or WDM light source. Generally, as rate limiting factors of the optical output of the SLED until now, likewise the semiconductor laser, there are considered three factors of (1) heat saturation (saturation due to heat generation according to current injection), (2) spatial hole burning (gain reduction due to its own optical output), and (3) catastrophic optical damage (COD) level. Effective measures are area enlargement of a light emitting region (active layer) as for (1), photon density reduction in a maximum optical output position within an optical waveguide as for (2), and photon density reduction in a light emitting edge as for (3), respectively.

As in a device which has a single wavelength or a relatively narrow wavelength band like a light active device which has the light emitting wavelength (mainly guided-mode light) such as semiconductor laser or a semiconductor optical amplifier, etc., and then a single mode optical output is further needed, a high output mechanism using an active MMI structure as a solution mechanism for the aforementioned three problems (1) to (3) is proposed in patent documents such as Patent Document 1 (Japanese Laid-open patent publication No. 11-068241) and Patent Document 2 (Japanese Laid-open patent publication No. 11-068240), or the like.

However, since one of important characteristics of the super-luminescent light emitting diode is a wide light emitting bandwidth (at least several tens of nm or more), it has been considered to be difficult to apply the active MMI structure until now. The reason is that when it is well known for a multi-mode interference region to have wavelength dependency and the light emitting wavelength to be objected from a central wavelength of the multi mode interference region is equal to or more than 10 nm, a self-image forming phenomenon does not completely occur for the light emitting wavelength, thereby leading to a problem that in the super-luminescent light emitting diode having the originally wide light emitting bandwidth, the light emitting bandwidth is not wide at the beginning. In addition, when the high optical output obtained upon applying the active MMI structure is delivered from the optical waveguide, it has a problem in that internal oscillation may not be sufficiently suppressed just to carry out anti-reflective coating on both edges of the optical waveguide.

In view of the above, it is an object of the present invention to provide a super-luminescent light emitting diode including an optical waveguide structure which supplies high optical output.

Means for Solving the Problem

According to the present invention, there is provided a super-luminescent light emitting diode comprising: a semiconductor substrate; a multimode interference optical waveguide that is formed on the semiconductor substrate; a first optical waveguide which is formed on the semiconductor substrate, of which one end is optically connected to one end of the multimode interference optical waveguide, and of which the other end forms a first light emitting edge; and a second optical waveguide which is formed on the semiconductor substrate, of which one end is optically connected to the other end of the multimode interference optical waveguide, and of which the other end forms a second light emitting edge. In the super-luminescent light emitting diode, each of the first and second optical waveguides has a width smaller than the width of the multimode interference optical waveguide, and the first light emitting edge is inclined to an optical axis of the first optical waveguide at the other end of the first optical waveguide, and the second light emitting edge is inclined to the optical axis of the second optical waveguide at the other end of the second optical waveguide.

The first and second optical waveguides may be disposed in an inclined direction to the first and second light emitting edges.

The first and second optical waveguides should be single mode waveguides.

Alternatively, each of the first and second optical waveguides may be a secondary mode cutoff waveguide.

Further, it is desirable that a first and second tapered optical waveguides are provided between one end of the multimode interference optical waveguide and one end of the first optical waveguide, and the first and second tapered optical waveguides have the width which is gradually increased from the one end of the first optical waveguide toward the one end of the multimode interference optical waveguide.

Further, it is desirable that a third and fourth tapered optical waveguides are provided between one end of the multimode interference optical waveguide and one end of the second optical waveguide, and the third and fourth tapered optical waveguides have the width which is gradually increased from the one end of the second optical waveguide toward the one end of the multimode interference optical waveguide.

In addition, the multimode interference optical waveguide, the first optical waveguide and the second optical waveguide may include a light emitting layer that is formed on the semiconductor substrate, a clad layer that is formed on the light emitting layer and a contact layer that is formed on the clad layer, so that the light emitting layer has an optical waveguide structure.

Further, each of the first and second light emitting edges may be a low reflectance edge.

The super-luminescent light emitting diode according to the present invention acts as a light emitting diode to particularly obtain high optical output as compared to the related art.

Effect of the Invention

A first effect of the present invention is that the high optical output may be obtained without losing light emitting efficiency. A second effect is that the high optical output may be obtained without making the light emitting band narrow while obtaining the high optical output.

BRIEF DESCRIPTION OF THE DRAWINGS

FIGS. 4(a) and (b) show a method of manufacturing the super-luminescent light emitting diode according to the first embodiment of the present invention, wherein FIG. 4A shows cross sectional view after a MOCVD process and FIG. 4B shows cross sectional view after a formation of a mask;

FIG. 5 shows a method of manufacturing the super-luminescent light emitting diode according to the first embodiment of the present invention, wherein FIG. 5A shows cross sectional view after an ICP etching process and FIG. 5B shows cross sectional view after a removal of a mask;

Figure 1:
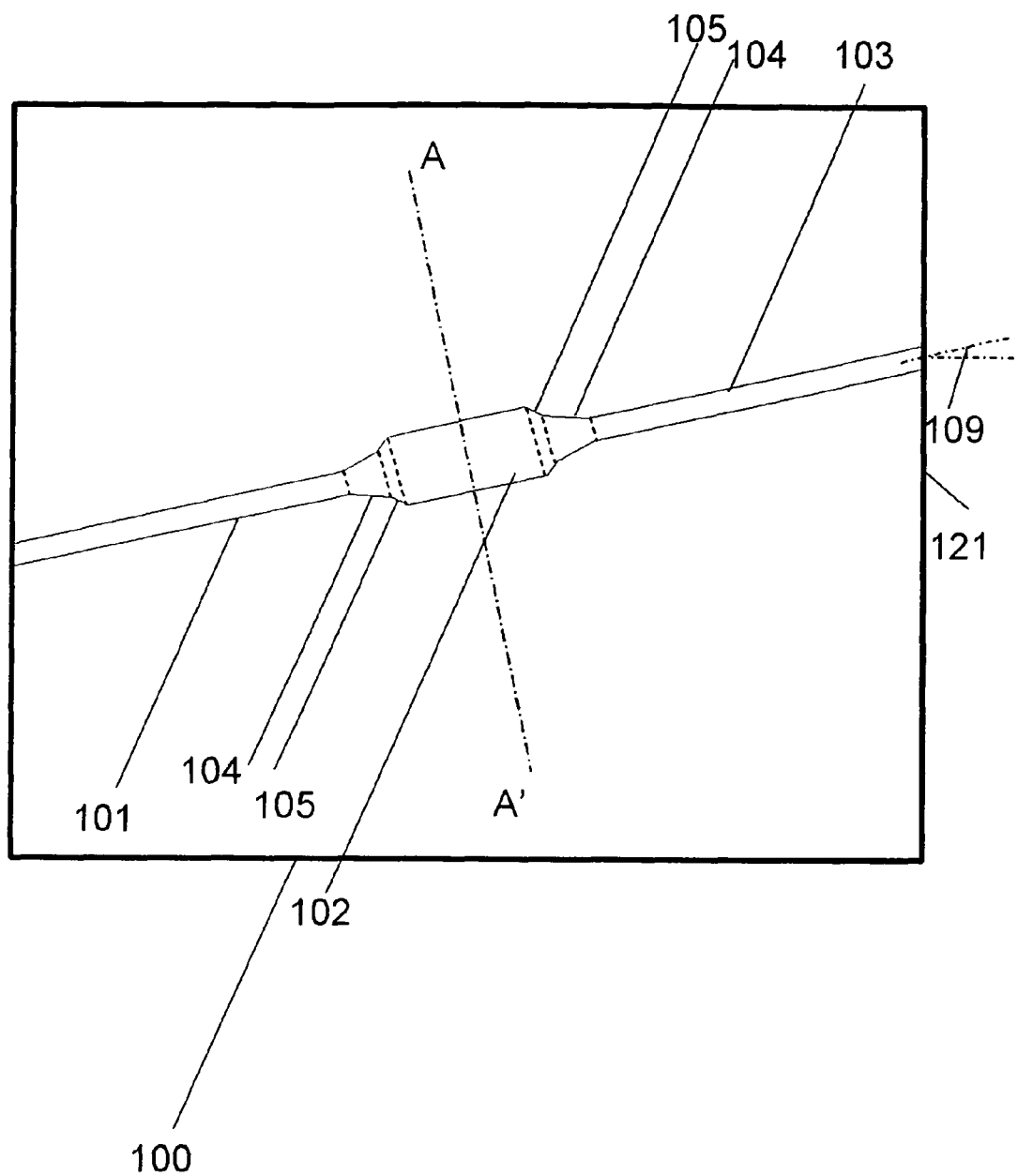
FIG. 1 schematically shows a configuration of an optical waveguide of a super-luminescent light emitting diode according to a first embodiment of the present invention.

EXPLANATIONS OF NUMERALS 100 substrate
101 first optical waveguide
102 multi mode interference optical waveguide
103 second optical waveguide
104, 105 taper optical waveguide
106 third optical waveguide
109 angle to a vertical line to a light emitting edge 121
121 light emitting edge
201 n-InP substrate
202 n-InP buffer layer
203 InGaAsP/InGaAsP-1.3 μm band light emitting layer
204 first p-InP clad layer
205 p-InGaAsP etching stopper layer
206 second p-InP clad layer
207 p-InGaAs contact layer
401 n-InP substrate
402 mask
403 ridge
404 $SiO_2$ film

BEST MODE FOR CARRYING OUT THE INVENTION

The various embodiments according to the invention will be now described hereinafter.

First Embodiment

A first embodiment of the present invention will be described in detail with reference to the accompanying drawings. FIG. 1 is a top view showing schematically a configuration of an optical waveguide of a super-luminescent light emitting diode according to the first embodiment of the present invention.

FIG. 1 schematically shows a configuration of an optical waveguide of a super-luminescent light emitting diode as a first embodiment of the present invention. A first optical waveguide 101, a multi mode interference optical waveguide 102, a second optical waveguide 103, a first taper optical waveguide 104, and a second taper optical waveguide 105 are integrated on a semiconductor substrate 100.

One end of the first optical waveguide 101 is optically connected to one end of the multimode interference optical waveguide 102, and the other end of the first optical waveguide forms a first light emitting edge (left light emitting edge 121). One end of the second optical waveguide 103 is optically connected to the other end of the multimode interference optical waveguide 102, and the other end of the second optical waveguide forms a second light emitting edge (right light emitting edge 121). Each of the first and second optical waveguides 101 and 103 has a width smaller than the width of the multimode interference optical waveguide 102 in order to generate single mode light. The first light emitting edge is inclined to an optical axis of the first optical waveguide 101 at the other end of the first optical waveguide 101, and the second light emitting edge is inclined to an optical axis of the second optical waveguide 103 at the other end of the second optical waveguide 103.

Two-stage tapered optical waveguides (first and second tapered optical waveguides) 104 and 105 are provided between one end (left end) of the multimode interference optical waveguide 102 and one end of the first optical waveguide 101. The widths of these tapered optical waveguides 104 and 105 are gradually increased from one end of the first optical waveguide 101 toward one end of the multimode interference optical waveguide 102. In particular, the waveguide length of the tapered optical waveguide 104 is longer than that of the tapered optical waveguide 105, and the inclination angles (angles between the optical axis and the tapered portions) of tapered portions of the tapered optical waveguides 105 and 104 are different from each other. Further, the inclination angle of the tapered portion of the tapered optical waveguide 105 is larger than the inclination angle of the tapered portion of the tapered optical waveguide 104.

Meanwhile, two-stage tapered optical waveguides (third and fourth tapered optical waveguides) 104 and 105 are provided even between the other end (right end) of the multimode interference optical waveguide 102 and one end of the second optical waveguide 103. The widths of these tapered optical waveguides 104 and 105 are gradually increased from one end of the second optical waveguide 103 toward the other end of the multimode interference optical waveguide 102. In particular, the waveguide length of the tapered optical waveguide 104 is longer than that of the tapered optical waveguide 105, and the inclination angles of tapered portions of the tapered optical waveguides 105 and 104 are different from each other. Further, the inclination angle of the tapered portion of the tapered optical waveguide 105 is larger than the inclination angle of the tapered portion of the tapered optical waveguide 104.

According to the embodiment, a waveguide width of the first optical waveguide 101 and the second optical waveguide 103 is about 2 μm, an optical waveguide width at a connection of the first taper optical waveguide and the second taper optical waveguide is about 4 μm, and a waveguide width of the multi mode interference optical waveguide 102 is about 10 μm.

A length of the first optical waveguide 101 is about 200 μm, a length of the multi mode interference optical waveguide 102 is about 310 μm, a length of the second optical waveguide 103 is about 200 μm, a length of the first taper optical waveguide 104 is about 40 μm, and a length of the second taper optical waveguide 105 is about 5 μm.

Also, an angle 109 between a direction of a light axis of the first optical waveguide 101 and the second optical waveguide 103, and a vertical line to a light emitting edge 121 is θ=12 degrees. Preferably, the angle 109 is equal to or more than 3 degrees to equal to or less than 20 degrees, and more preferably, equal to or more than 5 degree to equal to or less than 20 degrees. Further, when the angle 109 is small, internal oscillation may not be suppressed and on the contrary, when the angle 109 is large, it is difficult to perform optical coupling of emitted light and an optical fiber with good efficiency. That is, if the angle 109 is excessively small (particularly, the angle is smaller than 3 degrees), the amount of return light reflected by the light emitting edge 121 is increased. For this reason, it may not be possible to suppress internal oscillation and it is difficult to obtain excellent light emitting wavelength characteristics without ripples. On the other hand, if the angle 109 is excessively large (particularly, the angle exceeds 20 degrees), light emitted from the light emitting edge 121 is refracted. For this reason, light may not efficiently enter an optical system (not shown), such as an optical fiber or a lens, and the connectivity between the light emitting edge 121 and the optical system, such as an optical fiber or a lens, deteriorates. Meanwhile, an optical component for guiding the light which is emitted from the light emitting edge 121 to the optical system, such as an optical fiber or a lens, may be provided.

Figure 2:
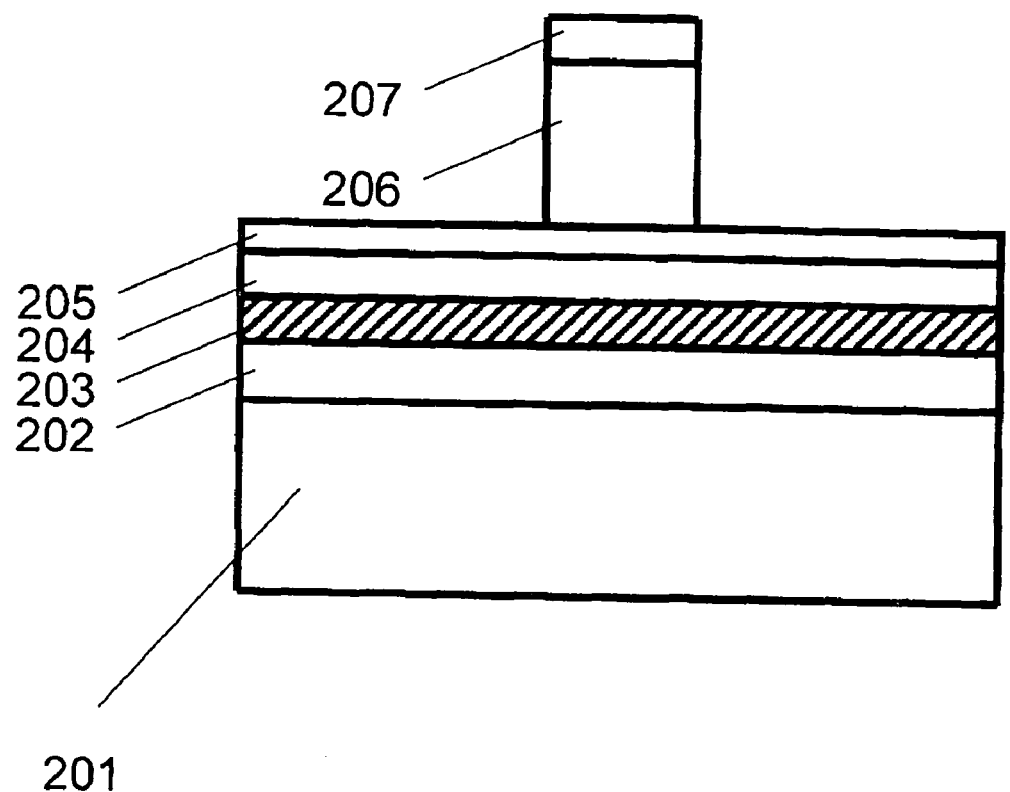
FIG. 2 shows a cross sectional view of structure of the optical waveguide taken along line A-A' of FIG. 1.

Also, a cross section structure of the optical waveguide taken along line A-A' of FIG. 1 is a ridge structure using a light emitting layer configured of a general multi quantum well, as shown in the cross sectional view of FIG. 2.

Also, the first optical waveguide 101, the multi mode interference optical waveguide 102, the second optical waveguide 103, the first taper optical waveguide 104, and the second taper optical waveguide 105 have the same layer structure, however, have a difference in the waveguide width.

The cross section structure shown in FIG. 2 includes, an n-InP buffer layer 202, an InGaAsP/InGaAsP-1.3 μm band light emitting layer 203, a first p-InP clad layer 204, a p-InGaAsP etching stopper layer 205, a second p-InP clad layer 206, and a p-InGaAs contact layer 207 which are formed on an n-InP substrate 201. The InGaAsP/InGaAsP-1.3 μm band light emitting layer 203 is a general light emitting layer configured of a separate confinement hetero-structure (SCH) and the multi quantum well.

As for a thickness of each layer, the n-InP buffer layer 202 is about 100 nm, InGaAsP/InGaAsP-1.3 μm band light emitting layer 203 about 100 nm, the first p-InP clad layer 204 about 200 nm, a p-InGaAsP etching stopper layer 205 about 10 nm, a second p-InP clad layer 206 about 800 nm, and a p-InGaAs contact layer 207 about 150 nm. A multilayer structure thereof is formed.

To consist a ridge structure, the p-InGaAs contact layer 207 and the second p-InP clad layer 206 are removed by an etching in a non-guided region, as shown in FIG. 2.

The multi mode interference optical waveguide 102 may be designed as follows by using, for example, a known Multimode interference (MMI) theory.

A formula for the bit length ($L_\pi$), which is required to obtain the length of the multi mode interference optical waveguide 102, may be represented as the following first formula.

$$W_e = W_1 + (\lambda_0/\pi)(Nc/Nr)^{2\sigma}(Nr^2 - Nc^2)^{-1/2}$$

$$L_\pi = 4Nr W_e^2 / 3\lambda_0 \qquad \text{[Math. 1]}$$

Here, $L_\pi$ denotes the bit length, W1 denotes the width of a multimode interference region, Nr denotes the refractive index of a waveguide, Nc denotes the refractive index of clad, and $\lambda_0$ denotes an optical wavelength. Further, σ is 0 in a TE mode, and σ is 1 in a TM mode.

If the length L of the multimode interference region is represented by the following second formula, the multi mode interference optical waveguide 102 may be operated as 1×N optical waveguides.

$$L = (3/4N)L_\pi \qquad \text{[Math. 2]}$$

(N is a Positive Integer)

Here, N denotes a positive integer that means the number of branch waveguides, and N is 1 in this embodiment. Further, if the multimode interference region is represented by the following third formula, the multi mode interference optical waveguide 102 may be operated as N×N optical waveguides that include N branch waveguides for light incidence and N branch waveguides for light emission.

$$L = (3/N)L_\pi \qquad \text{[Math. 3]}$$

(N is a Positive Integer)

However, N is 1 in this embodiment.

Meanwhile, when the multi mode interference optical waveguide 102 is designed by using the first or second formula, these theoretical formulas do not need to be exactly satisfied. For example, it is well known to those skilled in the art that the multimode interference waveguide may be obtained if the length of the multimode interference waveguide is deviated by about 10% from the values obtained by the theoretical formulas.

It may be possible to optimize the length L of the multimode interference region and the width $W_1$ of the multimode interference region by using the first to third formulas.

Hereinafter, in terms of the super-luminescent light emitting diode of the first embodiment according to the present invention, a principle that can obtain the high optical output without losing the light emitting efficiency and the high optical output without making the light emitting wavelength band almost narrow will be explained.

Generally, as rate limiting factors of the optical output of the SLED until now, likewise the semiconductor laser, there are considered three factors of (1) heat saturation (saturation due to heat generation according to current injection), (2) spatial hole burning (gain reduction due to its own optical output), and (3) catastrophic optical damage (COD) level.

Effective measures are area enlargement of a light emitting region (active layer) is effective measures as for (1), photon density reduction in a maximum optical output position within an optical waveguide as for (2) and photon density reduction in a light emitting edge for as for (3), respectively.

As in the semiconductor laser or a semiconductor optical amplifier, or the like, when a device uses the light emitting wavelength (mainly guided-mode light) to be objected as a single wavelength or a relatively narrow wavelength band, the high output mechanism using an active MMI structure as a mechanism for the aforementioned three problems is proposed in Patent Document 1 and Patent Document 2, or the like.

However, since one of important characteristics of the super-luminescent light emitting diode is a wide light emitting bandwidth (at least several tens of nm or more), it has been considered to be difficult to apply the active MMI structure until now. The reason is that it is well known for a multi-mode interference region to have wavelength dependency, thereby leading to a problem that in the super-luminescent light emitting diode having the originally wide light emitting bandwidth, the light emitting bandwidth is not wide at the beginning.

Figure 3:
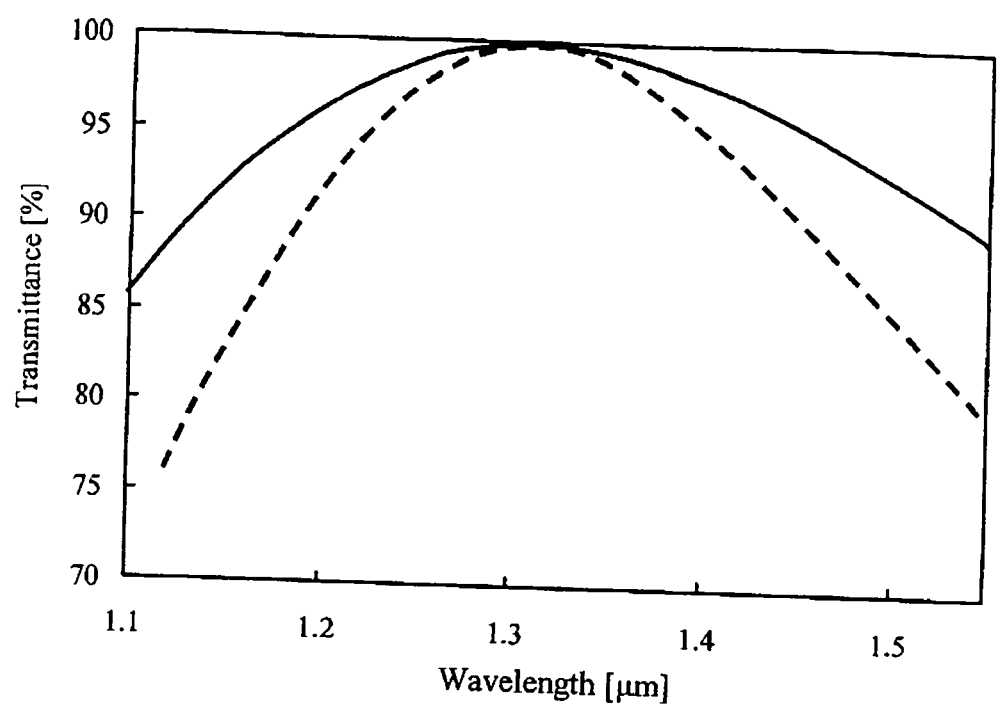
FIG. 3 shows an explanation of wavelength dependency of transmittance in the optical waveguide structure according to the present invention.

FIG. 3 is a diagram showing the result of the simulation for explaining the foregoing represents a generation or not of excessive loss in the overall waveguide as transmittance, and shows wavelength dependency of the transmittance in the active MMI structure of the related art (structure where both the first taper optical waveguide 104 and the second taper optical waveguide 105 are not connected) in a dotted line and wavelength dependency of the transmittance in the optical waveguide structure according to the present invention in a solid line.

As is clear from FIG. 3, high transmittance (that is, small excessive loss) is obtained in the wide wavelength range by an application of the present invention, as a result, the wide light emitting bandwidth of the characteristic of the super-luminescent light emitting diode to be secured. In particular, it may be possible to achieve high transmittance (that is, small excessive loss) in the wide wavelength range by the two-stage tapered optical waveguides 104 and 105.

Also, the light emitting layer 203 of the present invention is 1.3 μm band, but is not limited thereto. Therefore, the present invention may be applied in all the wavelength bands. The material group is a general InP/InGaAsP group; however, the present invention is not limited thereto. The present invention may use, for example, InP/InGaAlAs and may of course use the material groups suitable for other wavelength bands such as visible light band.

Also, the layer structure of the light emitting layer 203 is a general multi quantum well, but the present invention is not limited thereto. The present invention may also be applied to the light emitting layer 203 with the layer structure of a distortion quantum well or a general bulk light emitting layer.

Also, the optical waveguide structure is the ridge structure, but the present invention is not limited thereto. For example, the present invention may also be applied to a buried structure. Also, although both the first optical waveguide 101 and the second optical waveguide 103 are the single mode waveguide, they are not necessarily the single mode waveguide. Therefore, the present invention may also be applied to the first optical waveguide 101 and the second optical waveguide 103 configured as a secondary mode cutoff waveguide.

Also, although the multi mode interference optical waveguide 102 is disposed at a central position in a guided direction, it is not necessarily to dispose the optical waveguide 102 at the central position. In addition, the number of the multi mode interference optical waveguides 102 is not necessarily only one within a cavity. Further, it is generally sufficient for the super-luminescent light emitting diode to emit light from the edge of at least one of the first and second optical waveguides 101 and 103. For this reason, a photodetector for a monitor is optically connected to the edge of the other of the first and second optical waveguides 101 and 103. The photodetector for a monitor may be disposed outside the super-luminescent light emitting diode, or may be successively integrated into the first or second optical waveguide 101 or 103 in a monolithic or a hybrid manner.

Hereinafter, a method of manufacturing the first embodiment will be explained with reference to FIGS. 4(a), 4(b), 5(a) and 5(b). FIGS. 4(a), 4(b), 5(a) and 5(b) are cross sectional views for explaining a method of manufacturing the super-luminescent light emitting diode.

Figure 4:
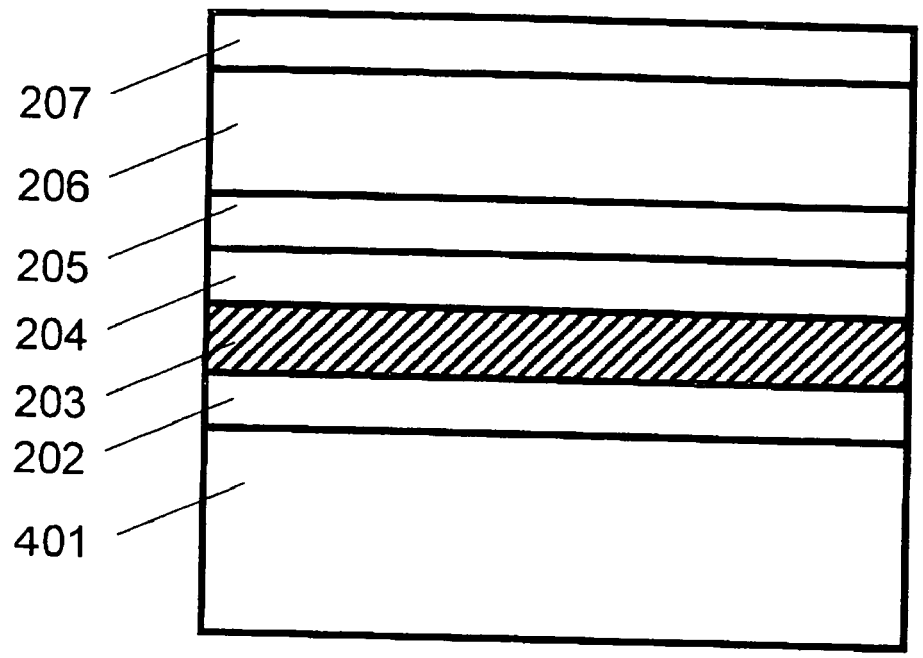
Figure 4:
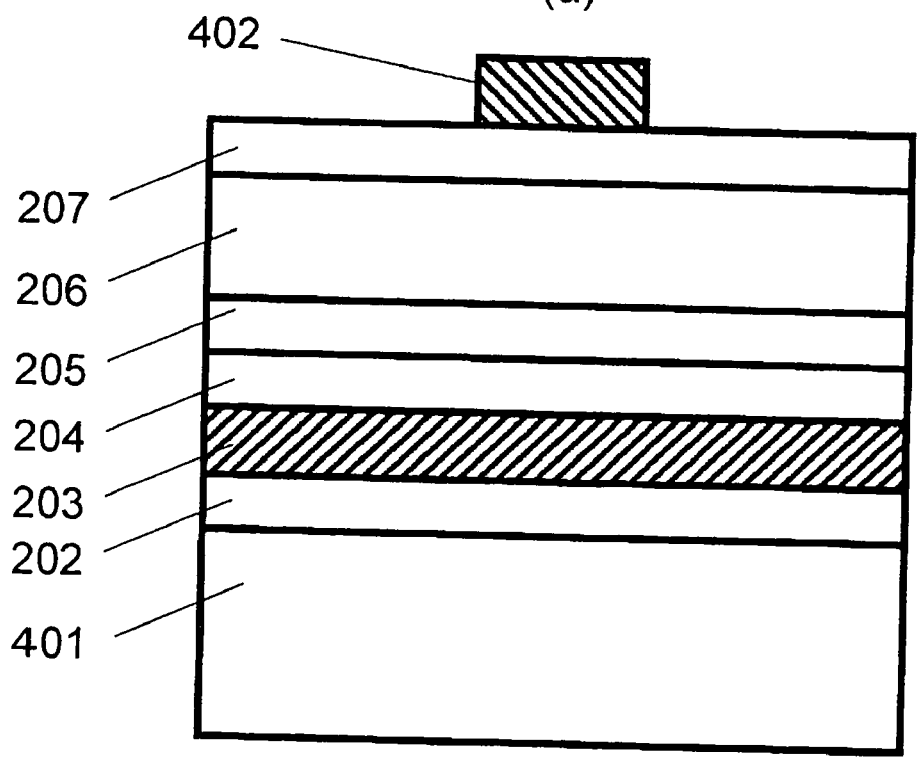

First, the n-InP buffer layer 202, the InGaAsP/InGaAsP-1.3 μm band light emitting layer 203, the first p-InP clad layer 204, the p-InGaAsP etching stopper layer 205, the second p-InP clad layer 206, and the p-InGaAs contact layer 207 are grown on a general n-InP substrate 401 by a MOCVD method (FIG. 4 (a)).

Next, a mask 402 in a waveguide shape is formed using a photolithography method by a stepper (reduction projection exposure) (FIG. 4(b)).

Figure 5:
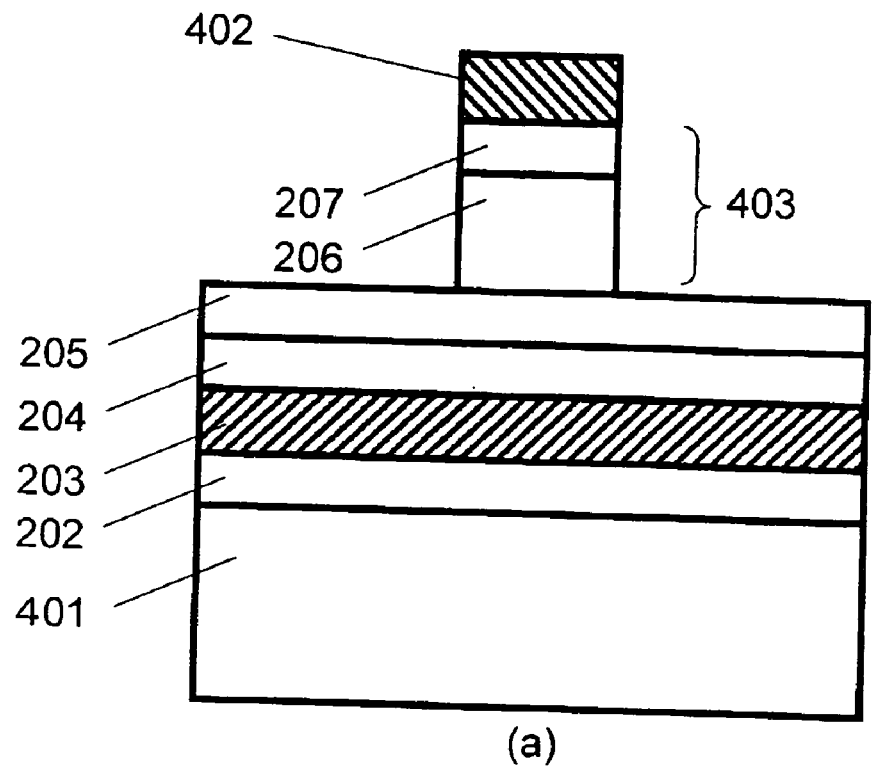
Figure 5:
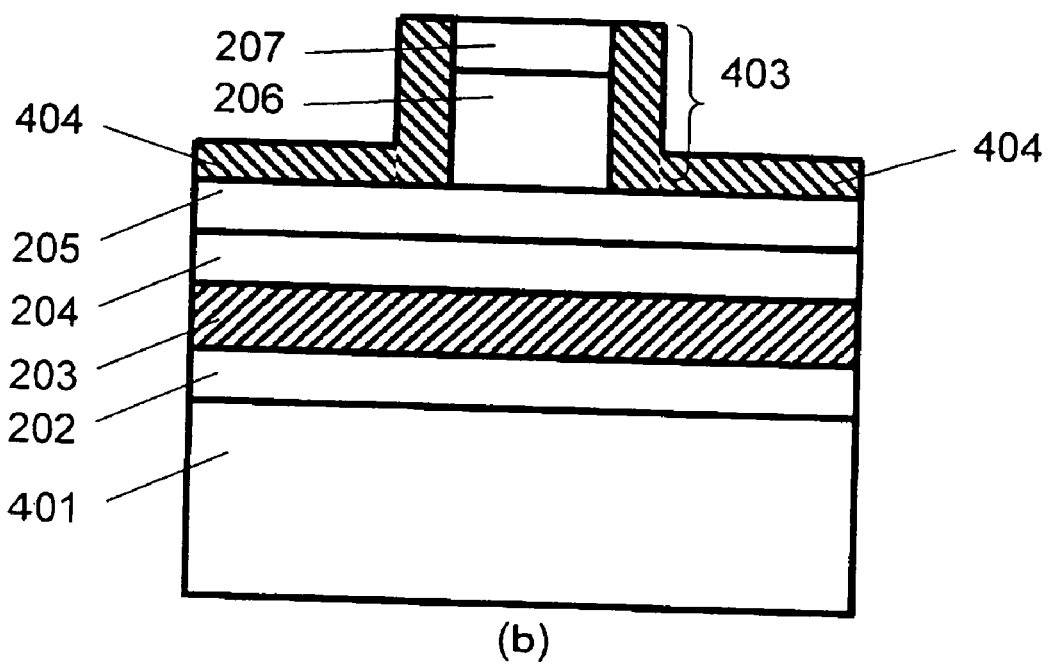

A ridge 403 is formed by performing the etching using the mask through an inductive coupled plasma (ICP) method (FIG. 5(a)).

Thereafter, an $SiO_2$ film 404 is deposited on an entire surface by a thermal CVD method, the $SiO_2$ film just above the ridge is removed using the photolithography method by the stepper (reduction projection exposure) (FIG. 5(b)), and an upper electrode material including Ti/Pt/Au is formed by an electron beam evaporation method.

Subsequently, a rear of a wafer is polished to form a rear electrode consisting of Ti/Au, an edge cleaving is performed in the light emitting edge position and the backward edge of a device, and a low reflective film coating (mirror with low reflectivity) is carried out on the edge of the device so that the manufacturing of the device is completed.

Any low reflective film may be used if it can transmit light. Therefore, the low reflective film may be formed on different edges of the incident optical waveguide 101 and the emitting optical waveguide 103.

The reflectivity of the low reflective film may be, for example, equal to or less than 0.1%. The low reflective film may be realized as a monolayer or a multilayer by stacking thin films made of different materials. As important factors for the performance of the low reflective film, the reflectance is low in the light emitting band.

The design of materials is properly changed according to the wavelength to be used. For example, oxides such as $SiO_2$, $SiNO_x$, $AlO_x$ or tantalum pentoxide, and fluoride compound such as lanthanum fluoride may be used. In the present embodiment, it may be preferable to use $SiO_2$.

Furthermore, in terms of the achievement of low reflectance, in this embodiment, it is preferable to perform the coating of a low reflection film by a sputtering method that is excellent in film thickness controllability, that is important in obtaining a low reflecting property, so that a low reflection film which is a single $SiO_2$ thin film as a quarter-wavelength film is obtained.

Also, the present embodiment uses the stepper for the photolithography but is not limited thereto. For example, the electron beam exposure may apply. Also, the thermal CVD method as a method of forming the $SiO_2$ film 404 is used, for example, a plasma CVD method or a sputtering method may be used. Also, the ICP method as a method of forming a mesa is not limited thereto, for example, an RIE method and a wet etching method. Further, stepped portions are formed on the surface of a wafer after the formation of a mesa. An embedding method using a material such as benzocyclobutene (BCB) or polyimide has been generally known to planarize the wafer by filling up the stepped portions. Accordingly, the same embedding method may be also applied to the invention. Meanwhile, low reflection coating is performed by a sputtering method in this embodiment. However, the invention is not limited thereto, and low reflection coating may be performed by, for example, an ECR-CVD method that uses an Electron cyclotron resonance (ECR) phenomenon.

Second Embodiment

Figure 6:
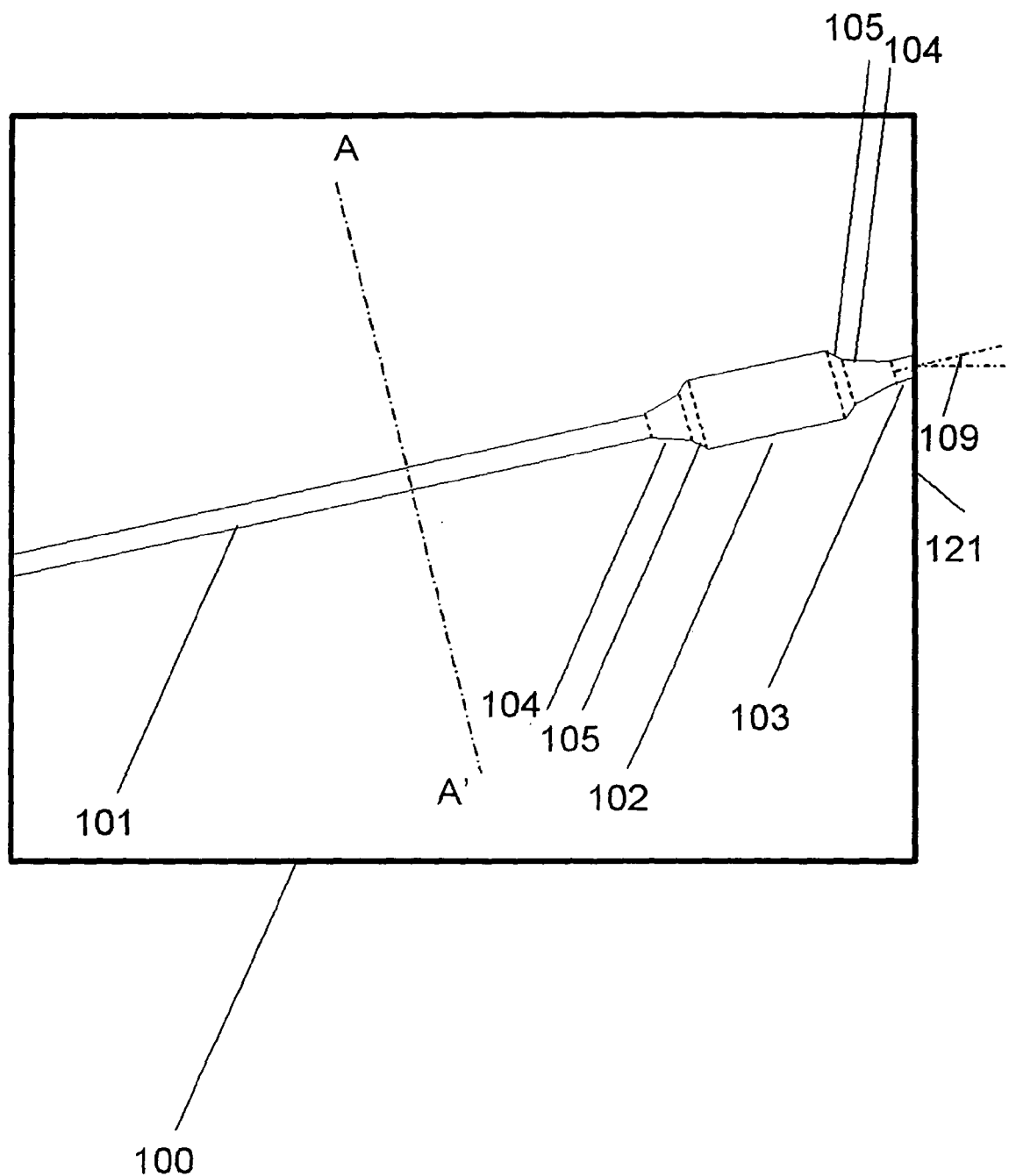
FIG. 6 schematically shows a configuration of an optical waveguide of a super-luminescent light emitting diode according to a second embodiment of the present invention.

Hereinafter, a second embodiment of the present invention will be described in detail with reference to the accompanying drawings. FIG. 6 is a top view showing schematically a configuration of an optical waveguide of a super-luminescent light emitting diode according to the second embodiment.

FIG. 6 schematically shows a configuration of an optical waveguide of a super-luminescent light emitting diode as a second embodiment of the present invention. Likewise the above-mentioned first embodiment, the first optical waveguide 101, the multi mode interference optical waveguide 102, the second optical waveguide 103, the first taper optical waveguide 104, and the second taper optical waveguide 105 are integrated on the substrate 100.

In the second embodiment, the only difference with the first embodiment is that the length of the first optical waveguide 101 is about 150 μm and the length of the second optical waveguide 103 is about 50 μm. The others are the same as the first embodiment.

Also, a cross section structure of the optical waveguide taken along line A-A' of FIG. 6 is the ridge structure using the light emitting layer configured of the general multi quantum well, as shown in FIG. 2 likewise the first embodiment.

Hereinafter, in terms of the super-luminescent light emitting diode of the second embodiment according to the present invention, a principle that can obtain the high optical output without losing the light emitting efficiency and the high optical output without making the light emitting wavelength band almost narrow will be explained.

As in the first embodiment, generally, as the rate limiting factors of the optical output of the SLED until now, likewise the semiconductor laser, there are considered three factors of (1) heat saturation (saturation due to heat generation according to current injection), (2) spatial hole burning (gain reduction due to its own optical output), and (3) catastrophic optical damage (COD) level. Effective measures are area enlargement of a light emitting region (active layer) as for (1), photon density reduction in a maximum optical output position within an optical waveguide as for (2), and photon density reduction in a light emitting edge as for (3), respectively.

As mentioned above, since one of important characteristics of the super-luminescent light emitting diode is a wide light emitting bandwidth (at least several tens of nm or more), it has been considered to be difficult to apply the active MMI structure until now. The reason is that when it is well known for a multi-mode interference region to have wavelength dependency, thereby leading to a problem that in the super-luminescent light emitting diode having the originally wide light emitting bandwidth, the light emitting bandwidth is not wide at the beginning.

Also in the optical waveguide structure of the super-luminescent light emitting diode, likewise the first embodiment, it is possible to realize the wavelength dependency of the transmittance shown by the solid line in FIG. 3. In short, as is clear from FIG. 3, high transmittance (that is, small excessive loss) is obtained in the wide wavelength range. As a result, the wide light emitting bandwidth of the characteristic of the super-luminescent light emitting diode to be secured.

In addition, the second embodiment has a structure where a position in a guided direction of the multi mode interference optical waveguide 102 is particularly closed to the light emitting edge. Thereby, a hole burning effect in the vicinity of the light emitting edge and the COD level are improved and higher optical output can be obtained.

Also, the light emitting layer 203 of the present invention is 1.3 μm band, but is not limited thereto. Therefore, the present invention may be applied in all the wavelength bands. The material group is the general InP/InGaAsP group; however, the present invention is not limited thereto. The present invention may use, for example, InP/InGaAlAs and may of course use the material groups suitable for other wavelength bands.

Also, the layer structure of the light emitting layer 203 is the general multi quantum well, but the present invention is not limited thereto. The present invention may also be applied to the light emitting layer 203 with the layer structure of the distortion quantum well or the general bulk light emitting layer.

Also, the optical waveguide structure is the ridge structure, but the present invention is not limited thereto. For example, the present invention may also be applied to the buried structure.

Also, although both the first optical waveguide 101 and the second optical waveguide 103 are the single mode waveguide, they are not necessarily the single mode waveguide. Therefore, the present invention may also be applied to the first optical waveguide 101 and the second optical waveguide 103 configured as the secondary mode cutoff waveguide.

In addition, the number of the multi mode interference optical waveguides 102 is not necessarily only one within a cavity. Also, the present invention has a structure where the second optical waveguide 103 is disposed, but may also be applied to a structure where the second optical waveguide 103 is omitted.

Third Embodiment

Figure 7:
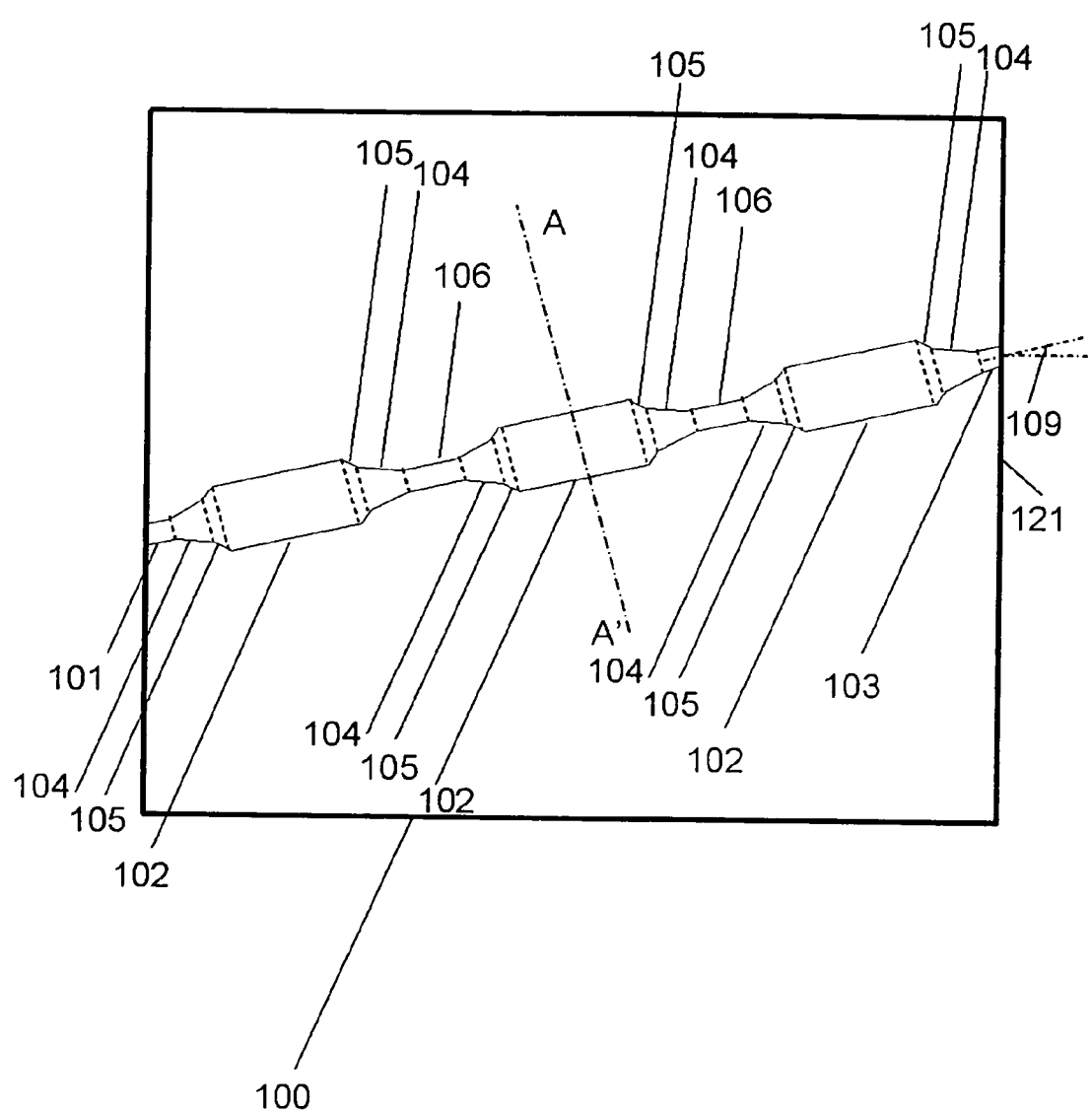
FIG. 7 schematically shows a configuration of an optical waveguide of a super-luminescent light emitting diode according to a third embodiment of the present invention.

Hereinafter, a third embodiment of the present invention will be described in detail with reference to the accompanying drawings. FIG. 7 is a top view showing schematically a configuration of an optical waveguide of a super-luminescent light emitting diode according to the third embodiment.

FIG. 7 schematically shows a configuration of an optical waveguide of a super-luminescent light emitting diode as a third embodiment of the present invention. The super-luminescent light emitting diode according to the third embodiment has a structure of connecting three multimode interference optical waveguide in series. In other words, sub-multimode interference optical waveguide 102 is provided between a first optical waveguide 101 and one end of the multimode interference optical waveguide 102 provided in the center, and between the second optical waveguide 103 and the other end of the multimode interference optical waveguide in the center. Likewise the above-mentioned first embodiment, the first optical waveguide 101, three of the multi mode interference optical waveguide 102, the second optical waveguide 103, the first taper optical waveguide 104, the second taper optical waveguide 105, and a third optical waveguide 106 are integrated on the substrate 100.

As is understood from FIG. 7, in the third embodiment, the only difference with the first embodiment is that the multi mode interference optical waveguide 102 and the first taper optical waveguides 104 and the second taper optical waveguides 105 forward and backward the waveguide are each disposed at three places, and the third optical waveguide 106 is integrated. The other configurations are the same as the first embodiment.

Also, a cross section structure of the optical waveguide taken along line A-A' of FIG. 7 is the ridge structure using the light emitting layer configured of the general multi quantum well, as shown in FIG. 2 likewise the first embodiment.

Also, the third optical waveguide 106 of the present invention has about 2 μm in width and 50 μm in length likewise the first optical waveguide 101 and the second optical waveguide 103.

Hereinafter, in terms of the super-luminescent light emitting diode of the third embodiment according to the present invention, a principle that can obtain the high optical output without losing the light emitting efficiency and the high optical output without making the light emitting wavelength band almost narrow will be explained.

Likewise the above-mentioned first embodiment, generally, as the rate limiting factors of the optical output of the SLED until now, likewise the semiconductor laser, there are considered three factors of (1) heat saturation (saturation due to heat generation according to current injection), (2) spatial hole burning (gain reduction due to its own optical output), and (3) catastrophic optical damage (COD) level. Effective measures are area enlargement of a light emitting region (active layer) as for (1), photon density reduction in a maximum optical output position within an optical waveguide as for (2), and photon density reduction in a light emitting edge are for (3), respectively.

As mentioned above, since one of important characteristics of the super-luminescent light emitting diode is a wide light emitting bandwidth (at least several tens of nm or more), it has been considered to be difficult to apply the active MMI structure until now. The reason is that when it is well known for a multi-mode interference region to have wavelength dependency, thereby leading to a problem that in the super-luminescent light emitting diode having the originally wide light emitting bandwidth, the light emitting bandwidth is not wide at the beginning.

Also in the optical waveguide structure of the super-luminescent light emitting diode of the third embodiment, high transmittance (that is, small excessive loss) is obtained in the wide wavelength range by an application of the present invention, as a result, the wide light emitting bandwidth of the characteristic of the super-luminescent light emitting diode to be secured.

In addition, the third embodiment has a structure where a plurality of multi mode interference optical waveguides 102 is disposed. Thereby, since the light emitting region is almost configured as the wide region, the structure with lower electric resistance, more excellent heat radiating effect, and smaller photon density within the waveguide is achieved to obtain higher optical output.

Also, the light emitting layer 203 of the present invention is 1.3 μm band, but is not limited thereto. Therefore, the present invention may be applied in all the wavelength bands. The material group is the general InP/InGaAsP group; however, the present invention is not limited thereto. The present invention may use, for example, InP/InGaAlAs and may of course use the material groups suitable for other wavelength bands.

Also, the layer structure of the light emitting layer 203 is the general multi quantum well, but the present invention is not limited thereto. The present invention may also be applied to the light emitting layer 203 with the layer structure of the distortion quantum well or the general bulk light emitting layer.

Also, the optical waveguide structure is the ridge structure, but the present invention is not limited thereto. For example, the present invention may also be applied to the buried structure. Also, although both the first optical waveguide 101 and the second optical waveguide 103 are the single mode waveguide, they are not necessarily the single mode waveguide. Therefore, the present invention may also be applied to the first optical waveguide 101 and the second optical waveguide 103 configured as the secondary mode cutoff waveguide.

In addition, the number of the multi mode interference optical waveguides 102 is not necessarily three within a cavity and may be two, and four or more may apply to the present invention. Also, although the present invention has a structure where the first optical waveguide 101, the second optical waveguide 103, and the third optical waveguide 106 have the same length, the length is not necessarily the same.

Also, the present embodiment has a structure where the three multi mode interference optical waveguides 102 are disposed but is not limited thereto, and four or more may apply to the present invention. Also, the present invention has a structure of the first and second taper optical waveguides but is not limited to two. Therefore, the present invention may also be applied to a structure where the taper optical waveguides equal to or more than three are disposed.

Fourth Embodiment

Figure 8:
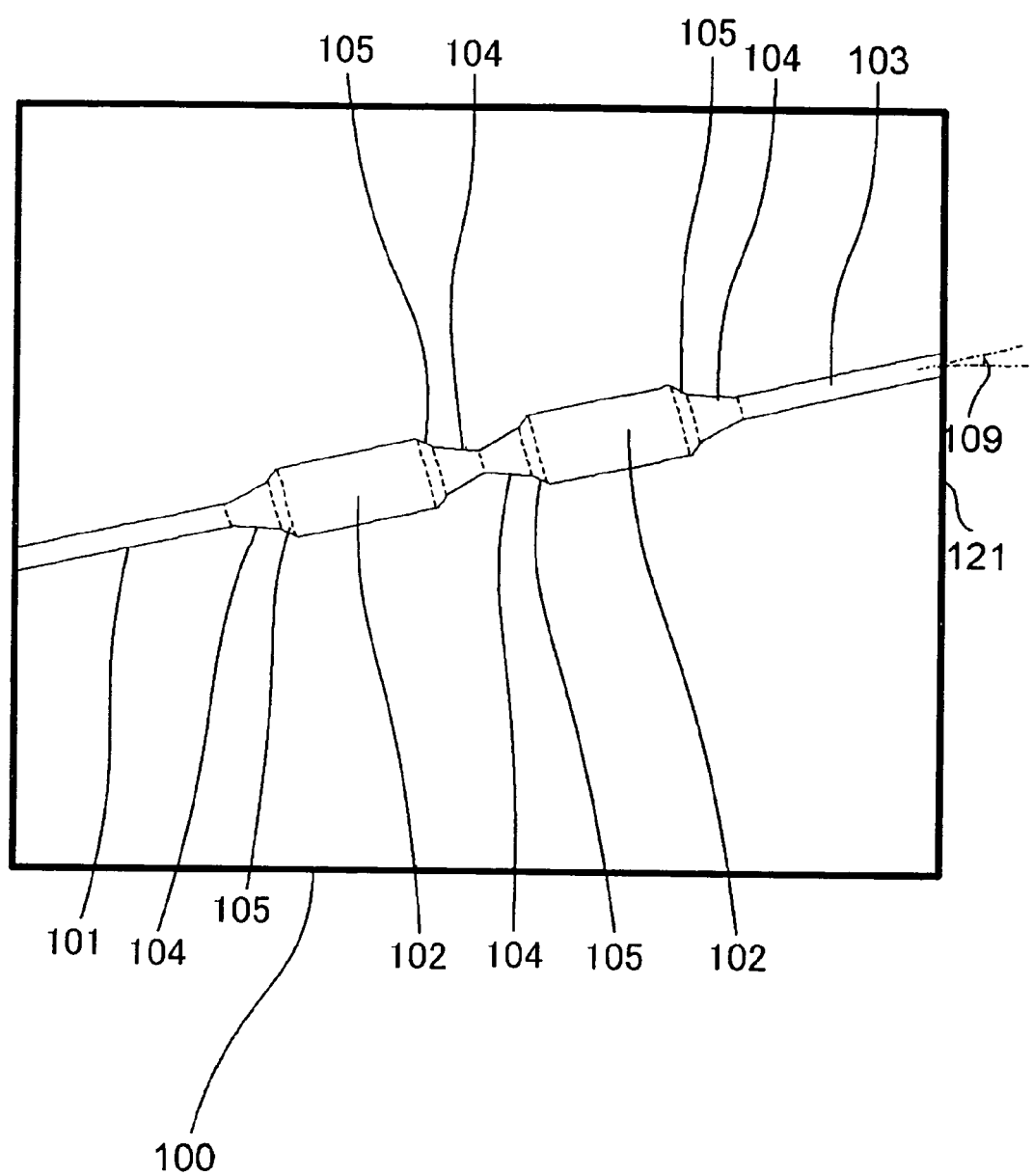
FIG. 8 schematically shows a configuration of an optical waveguide of a super-luminescent light emitting diode according to a fourth embodiment of the present invention.

Next, a fourth embodiment of the present invention will be described in detail with reference to the accompanying drawings. FIG. 8 is a top view showing schematically a configuration of an optical waveguide of a super-luminescent light emitting diode according to the fourth embodiment of the present invention.

Referring to FIG. 8, a super-luminescent light emitting diode according to a fourth embodiment has a structure where two multimode interference optical waveguides 102 and 102 are connected to each other in series on a semiconductor substrate 100. In other words, one multimode interference optical waveguide (sub-multimode optical waveguide) 102 is provided between a first optical waveguide 101 and one end of the other multimode interference optical waveguide 102 of two multimode interference optical waveguides 102. Other structure is substantially the same as the structure of the first embodiment except for the size of the optical waveguide or a part of the layered structure.

According to the forth embodiment, a waveguide width of the first optical waveguide 101 and the second optical waveguide 103 is about 4 μm, an optical waveguide width at a connection of the first taper optical waveguide 104 and the second taper optical waveguide 105 is about 7.5 μm, and a waveguide width of the multi mode interference optical waveguide 102 is about 10 μm. A length of the first optical waveguide 101 is about 70 μm, a length of the multi mode interference optical waveguide 102 is about 360 μm, a length of the second optical waveguide 103 is about 70 μm, a length of the first taper optical waveguide 104 is about 80 μm, and a length of the second taper optical waveguide 105 is about 5 μm.

Also, an angle 109 between a direction of a light axis of the first optical waveguide 101 and the second optical waveguide 103, and a vertical line to a light emitting edge 121 is θ=15 degrees. Preferably, the angle 109 is equal to or more than 3 degrees to equal to or less than 20 degrees, and more preferably, equal to or more than 5 degrees to equal to or less than 20 degrees. As mentioned above, when the angle 109 is small, internal oscillation may not be suppressed and on the contrary, when the angle 109 is large, it is difficult to perform optical coupling of emitted light and an optical fiber with good efficiency. Meanwhile, if θ is 15 degrees, the angle of the light emitted from the light emitting edge 121 is about 45 degrees. Accordingly, there is also an advantage that it is relatively easy to visibly determine the direction of an optical axis when mounting an element.

The cross section structure of the super-luminescent light emitting diode according to the fourth embodiment is identical to that in FIG. 2 except for the composition of the light emitting layer. That is, in the fourth embodiment, an InGaAlAs/InGaAlAs-1.55 μm band light emitting layer is formed instead of the InGaAsP/InGaAsP-1.3 μmband light emitting layer 203. The InGaAlAs/InGaAlAs-1.55 μm band light emitting layer is a general light emitting layer configured of a separate confinement hetero-structure (SCH) and the multi quantum well. Further, The InGaAlAs/InGaAlAs-1.55 μm band light emitting layer may be formed to have a thickness of about 100 nm by MOCVD method.

Also, the light emitting layer of the fourth embodiment is 1.55 μm band, but is not limited thereto. Therefore, the present invention may be applied in all the wavelength bands. The material group is the general InP/InGaAlAs group; however, the present invention is not limited thereto. The present invention may use, for example, InP/InGaAsP and may of course use the material groups suitable for other wavelength bands.

Also, the layer structure of the InGaAlAs/InGaAlAs-1.55 μm band light emitting layer is the general multi quantum well, but the present invention is not limited thereto. The present invention may also be applied to the light emitting layer with the layer structure of the distortion quantum well pr the general bulk light emitting layer.

In addition, the number of the multi mode interference optical waveguides 102 is not necessarily only two within a cavity.

Although the present invention has been described by way of exemplary embodiments, the present invention is not limited to the above embodiment. It is apparent to those skilled in the art that the present invention can be realized in other embodiments and may be modified and changed without departing from the scope and spirit of the invention.

For example, though the first optical wavelength 101 and the second optical wavelength 103 are formed in a straight line, it is not limited thereto and the first optical wavelength 101 and the second optical wavelength 103 may have curvature so as the light emitting edge 121 to be inclined with an appropriate angle to an optical axis of the first optical waveguide 101 and the second optical waveguide 103.

The invention claimed is:

1. A super-luminescent light emitting diode comprising:
a semiconductor substrate;
a multimode interference optical waveguide that is formed on said semiconductor substrate;
a first optical waveguide which is formed on said semiconductor substrate, of which one end is optically connected to one end of said multimode interference optical waveguide, and of which an other end forms a first light emitting edge; and
a second optical waveguide which is formed on said semiconductor substrate, of which one end is optically connected to an other end of said multimode interference optical waveguide, and of which an other end forms a second light emitting edge,
wherein each of said first and second optical waveguides comprises a width that is smaller than a width of said multimode interference optical waveguide,
wherein said first light emitting edge is inclined to an optical axis of said first optical waveguide at the other end of said first optical waveguide, and
wherein said second light emitting edge is inclined to an optical axis of said second optical waveguide at the other end of said second optical waveguide; wherein the optical axis of the first light emitting edge forms an angle with the first light emitting edge, and the angle comprises a range of three degrees to twenty degrees.

2. The super-luminescent light emitting diode according to claim 1, wherein said first optical waveguide is disposed in an inclined direction to said first light emitting edge.

3. The super-luminescent light emitting diode according to claim 1, wherein said second optical waveguide is disposed in an inclined direction to said second light emitting edge.

4. The super-luminescent light emitting diode according to claim 1, wherein each of said first and second optical waveguides further comprises a single mode waveguide.

5. The super-luminescent light emitting diode according to claim 1, wherein each of said first and second optical waveguides is further comprises a secondary mode cutoff wave guide.

6. The super-luminescent light emitting diode according to claim 1, further comprising:
a tapered optical waveguide which is provided between the one end of said multimode interference optical waveguide and the one end of said first optical waveguide, and of which a width is gradually increased from the one end of said first optical waveguide toward the one end of said multimode interference optical waveguide.

7. The super-luminescent light emitting diode according to claim 6, wherein said tapered optical waveguide includes first and second tapered optical waveguides, and
inclination angles of tapered portions of said first and second tapered optical waveguides are different from each other.

8. The super-luminescent light emitting diode according to claim 7, wherein a waveguide length of said first tapered optical waveguide is longer than a waveguide length of said second tapered optical waveguide.

9. The super-luminescent light emitting diode according to claim 1, further comprising:
a tapered optical waveguide which is provided between the other end of said multimode interference optical waveguide and the one end of said second optical waveguide, and of which a width is gradually increased from the one end of said second optical waveguide toward the other end of said multimode interference optical waveguide.

10. The super-luminescent light emitting diode according to claim 9, wherein said tapered optical waveguide includes third and fourth tapered optical waveguides, and
inclination angles of tapered portions of said third and fourth tapered optical waveguides are different from each other.

11. The super-luminescent light emitting diode according to claim 10, wherein a waveguide length of said third tapered optical waveguide is longer than a waveguide length of said fourth tapered optical waveguide.

12. The super-luminescent light emitting diode according to claim 1, wherein said multimode interference optical waveguide, said first optical waveguide, and said second optical waveguide include:
- a light emitting layer that is formed on said semiconductor substrate;
- a clad layer that is formed on said light emitting layer; and
- a contact layer that is formed on said clad layer, and
- wherein said light emitting layer comprises an optical waveguide structure.

13. The super-luminescent light emitting diode according to claim 1, wherein each of said first and second light emitting edges comprises a low reflectance edge.

14. The super-luminescent light emitting diode according to claim 1, further comprising:
- a sub-multimode interference optical waveguide that is provided between said first optical waveguide and the one end of said multimode interference optical waveguide.

15. The super-luminescent light emitting diode according to claim 1, further comprising:
- a sub-multimode interference optical waveguide that is provided between said second optical waveguide and the other end of said multimode interference optical waveguide.

16. The super-luminescent light emitting diode according to claim 1, wherein the super-luminescent light emitting diode further comprises a wide light emitting bandwidth of at least 20 nm.

17. The super-luminescent light emitting diode according to claim 1, wherein the first optical waveguide has a length that is longer than a length of the second optical waveguide.

18. A super-luminescent light emitting diode comprising:
- a semiconductor substrate;
- a first multimode interference optical waveguide that is formed on said semiconductor substrate;
- a first optical waveguide which is formed on said semiconductor substrate, of which one end is optically connected to one end of said first multimode interference optical waveguide, and of which an other end forms a first light emitting edge;
- a second optical waveguide which is formed on the semiconductor substrate comprising a first end that is forms a second light emitting edge; and
- a second multimode interference optical waveguide that is formed on the semiconductor substrate comprising a first end that is connected to a second end of the second optical waveguide,
- wherein each of said first and second optical waveguides comprises a width that is smaller than a width of each of said first and second multimode interference optical waveguides,
- wherein said first light emitting edge is inclined to an optical axis of said first optical waveguide at the other end of said first optical waveguide, and
- wherein said second light emitting edge is inclined to an optical axis of said second optical waveguide at the other end of said second optical waveguide; wherein the optical axis of the first light emitting edge forms an angle with the first light emitting edge, and the angle comprises a range of three degrees to twenty degrees.

19. The super-luminescent light emitting diode according to claim 18, further comprising a third multimode interference optical waveguide that is formed on the semiconductor substrate, the third multimode interference optical waveguide, comprising:
- a first end that is optically connected to an other end of the first multimode interference optical waveguide; and
- a second end that is optically connected to a second end of the second multimode interference optical waveguide.

* * * * *